(12) United States Patent
Auvenshine et al.

(10) Patent No.: US 10,671,327 B2
(45) Date of Patent: *Jun. 2, 2020

(54) METHOD FOR DETERMINING SELECTION AND ORDERING OF STORAGE VOLUMES TO COMPRESS

(71) Applicant: International Business Machines Corporation, Armonk, NY (US)

(72) Inventors: John J. Auvenshine, Tucson, AZ (US); Per Lutkemeyer, Lystrup (DK); Laura Richardson, Tampa, FL (US); David Schustek, Parker, CO (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/296,987

(22) Filed: Mar. 8, 2019

(65) Prior Publication Data

US 2019/0205032 A1 Jul. 4, 2019

Related U.S. Application Data

(63) Continuation of application No. 15/496,033, filed on Apr. 25, 2017, now Pat. No. 10,303,400.

(51) Int. Cl.
*G06F 5/06* (2006.01)
*G06F 3/06* (2006.01)
(Continued)

(52) U.S. Cl.
CPC .............. *G06F 3/067* (2013.01); *G06F 3/064* (2013.01); *G06F 3/0608* (2013.01);
(Continued)

(58) Field of Classification Search
CPC ........ G06F 3/067; G06F 3/0608; G06F 3/064; G06F 3/0644; G06F 3/0661; H03M 7/16; H03M 7/30; H03M 13/03
See application file for complete search history.

(56) References Cited

U.S. PATENT DOCUMENTS 7,895,242 B2 ‡ 2/2011 Ergan ................... G06F 12/0802
707/80
8,250,335 B2 ‡ 8/2012 Whyte ................... G06F 3/0608
711/11
(Continued)

OTHER PUBLICATIONS

Non-Final Office action for U.S. Appl. No. 15/844,561, filed Dec. 17, 2017, dated Oct. 29, 2018. fed.‡

(Continued)

*Primary Examiner* — Eric Cardwell
(74) *Attorney, Agent, or Firm* — Maeve Carpenter, Esq.; George S. Blasiak, Esq.; Heslin Rothenberg Farley & Mesiti PC

(57) ABSTRACT

Methods, computer program products, and systems are presented. The method computer program products, and systems can include, for instance: examining information of first through Nth storage volumes and based on the examining providing for each storage volume of the first through Nth storage volumes a predicted storage space savings value, the predicted storage space savings value indicating a predicted terabyte volume of storage space savings producible by performance of data compression of data stored on the storage volume; predicting a per terabyte compression cost savings associated with compressing one or more storage volume of the first through Nth storage volumes, and providing a ranking of storage volumes of the first through Nth storage volumes based on the examining and the predicting; and scheduling a compression of storage volumes of the first through Nth storage volumes based on the ranking of storage volumes of the first through Nth storage volumes.

20 Claims, 8 Drawing Sheets

(51) Int. Cl.
*H03M 7/30* (2006.01)
*H03M 7/16* (2006.01)
*H03M 13/03* (2006.01)

(52) U.S. Cl.
CPC .......... *G06F 3/0644* (2013.01); *G06F 3/0661* (2013.01); *H03M 7/16* (2013.01); *H03M 7/30* (2013.01); *H03M 13/03* (2013.01)

(56) References Cited

U.S. PATENT DOCUMENTS

| | | | | |
|---|---|---|---|---|
| 8,478,731 | B1 * | 7/2013 | Throop | G06F 16/1744 707/693 |
| 9,048,862 | B2 ‡ | 6/2015 | Condict | H03M 7/607 |
| 10,303,400 | B2 | 5/2019 | Auvenshine | |
| 10,331,382 | B2 | 6/2019 | Auvenshine | |
| 2004/0055020 | A1 ‡ | 3/2004 | Delpuch | H04N 5/76 725/13 |
| 2013/0006948 | A1 ‡ | 1/2013 | Shmueli | G06F 16/185 707/69 |
| 2017/0103356 | A1 * | 4/2017 | Sabloniere | G06Q 10/06315 |

OTHER PUBLICATIONS

Applicant's Response to Non-Final Office Action, U.S. Appl. No. 15/844,561, filed Dec. 17, 2017, dated Dec. 28, 2018.‡

Notice of Allowance, U.S. Appl. No. 15/844,561, filed Dec. 17, 2017, dated Feb. 4, 2019.‡

List of IBM Patent and/or Patent Applications treated as related for U.S. Appl. No. 15/496,033, filed Apr. 25, 2017, dated Dec. 17, 2017.‡

Auvenshine, et al. "Method for Determining Selection and Ordering of Storage Volumes to Compress" U.S. Appl. No. 15/844,561, filed Dec. 17, 2017.‡

Ordonez, et al., "Data mining algorithms as a service in the cloud exploiting relational database systems." Proceedings of the 2013 ACM SIGMOD International Conference on Management of Data. ACM, 2013.‡

Chauhan, et al., "Energy Efficient Sleep Scheduled Clustering & Spanning Tree Based Data Aggregation in Wireless Sensor Network." Recent Advanced in Information Technology, (RAIT), 2012 1st International Conference on IEEE 2012.‡

P. Mell, et al. "*The NIST Definition of Cloud Computing*", NIST Special Publication 800-145, Sep. 2011, Gaithersburg, MD.

List of IBM Patent and/or Patent Applications treated as related for U.S. Appl. No. 16/296,987, filed Mar. 8, 2019, dated Jul. 18, 2019.

\* cited by examiner
‡ imported from a related application

METHOD FOR DETERMINING SELECTION AND ORDERING OF STORAGE VOLUMES TO COMPRESS

CROSS-REFERENCE TO RELATED APPLICATION

This application is a continuation of U.S. application Ser. No. 15/844,561, filed Dec. 17, 2017, titled "Method for Determining Selection and Ordering of Storage Volumes to Compress", which is incorporated by reference herein in its entirety, which is a continuation of U.S. application Ser. No. 15/496,033, filed Apr. 25, 2017, titled "Method for Determining Selection and Ordering of Storage Volumes to Compress", which is incorporated by reference herein in its entirety.

BACKGROUND

With increasing demand for faster, more powerful and more efficient ways to store information, optimization of storage technologies becomes one of the key challenges. The logical data objects (data files, image files, data blocks, etc.) may be transformed for transmission and/or storage. The transformation may comprise compression, encryption, encoding, conversion, etc. and/or combinations thereof. For example, data compression techniques are used to reduce the amount of data to be stored or transmitted in order to reduce the storage capacity and transmission time respectively. Compression may be achieved by using different compression algorithms.

Computer systems can use data compression to reduce the number of storage devices needed to store data, thereby reducing equipment and operational costs. Algorithms used to compress data include, but are not limited to, zlib, Graphics interchange Format (GIF), portable network graphics (PNG), lz4 and Roshal archive (rar). Compression algorithms data can provide a reduction of data footprints, and are typically dependent on the data that is to be compressed. For example, data which was previously compressed may not be reduced, whereas previously uncompressed text files can be reduced up to 90% of their original size.

SUMMARY

Shortcomings of the prior art are overcome, and additional advantages are provided, through the provision, in one aspect, of a method. The method can include, for example: examining information of first through Nth storage volumes and based on the examining providing for each storage volume of the first through Nth storage volumes a predicted storage space savings value; the predicted storage space savings value indicating a predicted terabyte volume of storage space savings producible by performance of data compression of data stored on the storage volume; predicting a per terabyte compression cost savings associated with compressing one or more storage volume of the first through Nth storage volumes, and providing a ranking of storage volumes of the first through Nth storage volumes based on the examining and the predicting; and scheduling a compression of storage volumes of the first through Nth storage volumes based on the ranking of storage volumes of the first through Nth storage volumes.

In another aspect, a computer program product can be provided. The computer program product can include a computer readable storage medium readable by one or more processing circuit and storing instructions for execution by one or more processor for performing a method. The method can include, for example: examining information of first through Nth storage volumes and based on the examining providing for each storage volume of the first through Nth storage volumes a predicted storage space savings value; the predicted storage space savings value indicating a predicted terabyte volume of storage space savings producible by performance of data compression of data stored on the storage volume; predicting a per terabyte compression cost savings associated with compressing one or more storage volume of the first through Nth storage volumes, and providing a ranking of storage volumes of the first through Nth storage volumes based on the examining and the predicting; and scheduling a compression of storage volumes of the first through Nth storage volumes based on the ranking of storage volumes of the first through Nth storage volumes.

In a further aspect, a system can be provided. The system can include, for example a memory. In addition, the system can include one or more processor in communication with the memory. Further, the system can include program instructions executable by the one or more processor via the memory to perform a method. The method can include, for example: examining information of first through Nth storage volumes and based on the examining providing for each storage volume of the first through Nth storage volumes a predicted storage space savings value; the predicted storage space savings value indicating a predicted terabyte volume of storage space savings producible by performance of data compression of data stored on the storage volume; predicting a per terabyte compression cost savings associated with compressing one or more storage volume of the first through Nth storage volumes, and providing a ranking of storage volumes of the first through Nth storage volumes based on the examining and the predicting; and scheduling a compression of storage volumes of the first through Nth storage volumes based on the ranking of storage volumes of the first through Nth storage volumes.

Additional features are realized through the techniques set forth herein. Other embodiments and aspects, including but not limited to methods, computer program product and system, are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
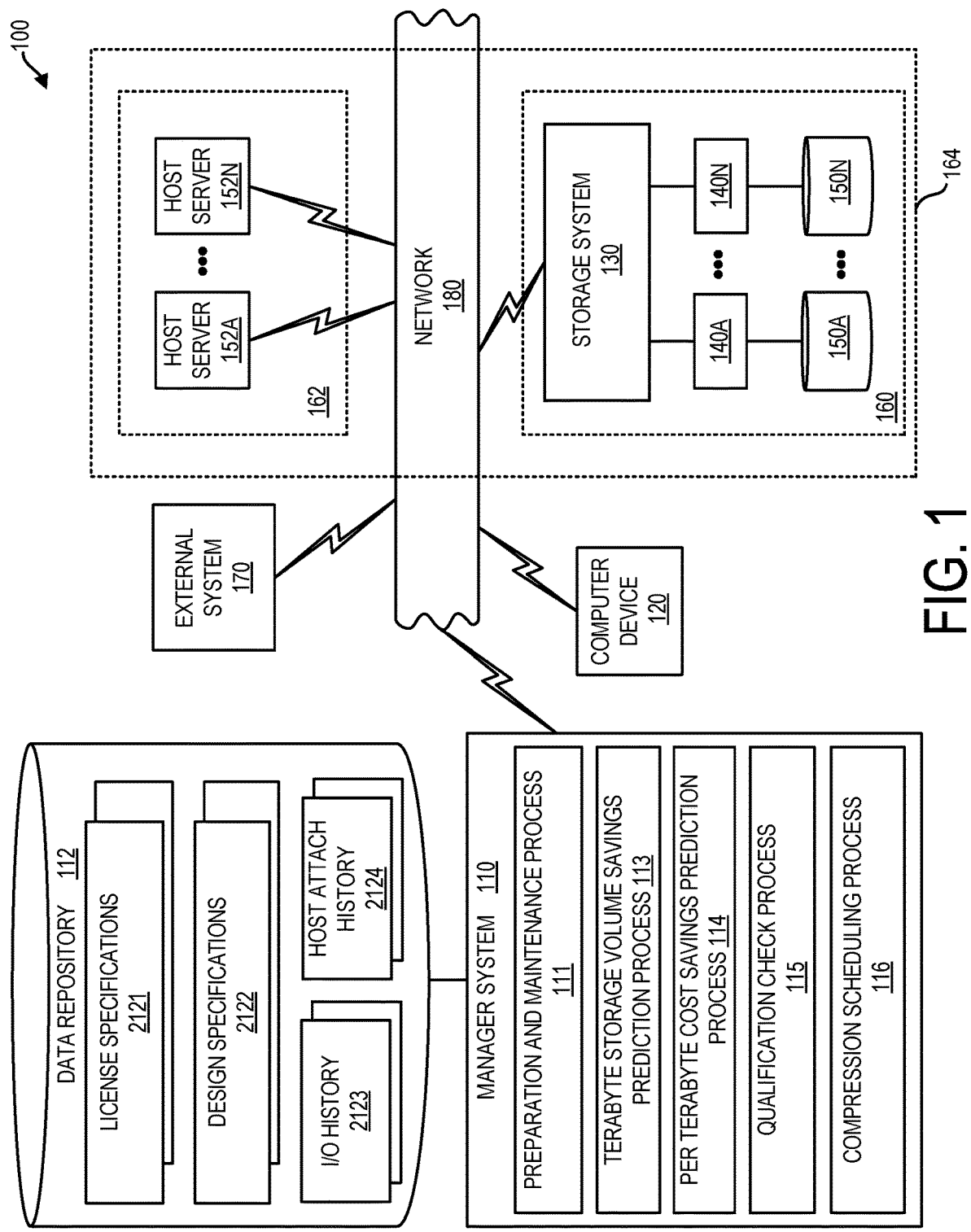
FIG. 1 depicts a system having manager system and a storage environment in one embodiment.

System 100 for use in managing compression of data as storage environment is shown in FIG. 1. System 100 can include a manager system 110 having an associated data repository 112, a computer device 120 e.g. for use by an administrator user, storage system 130 in communication with storage volumes 150A-150N having associated storage volume controllers 140A-140N, each of a plurality of storage volumes 150A-150N can have a respective storage volume controller 140A-140N. System 100 can further include one or more external system 170 provided e.g. having information from which license specification records and design specification records can be derived. Manager system 110, computer device 120, storage system 130, and one or more external system 170 can be in communication with one another via network 180. Network 180 can include one or more physical telecommunications network and can include one or more virtual network. Storage system 130, storage volumes 150A-150N and their respective storage volume controllers 140A-140N can be disposed in a storage environment 160.

Manager system 110 can run a preparation and maintenance process 111 for use in populating, preparing, and maintaining data of data repository 112 for use in various processes, such as processes 113-116 as set forth herein. Manager system 110 can run terabyte storage volume savings prediction process 113 to determine available terabyte storage volume savings available by way of performing compression on one or more storage volume 150A-150N. Manager system 110 can run per terabyte cost savings prediction process 114 to predict cost savings per terabyte available by performance of compression on one or more storage volume 150A-150N. Manager system 110 can run qualification check process 115 to determine if one or more storage volume 150A-150N is qualified for being subject to data compression. Manager system 110 can run compression scheduling process 116 to schedule compression of data of one or more storage volume 150A-150N.

Data repository 112 in license specifications area 2121 can store records that specify specifications for various data storage licenses for storage services provided by system 100. Data repository 112 in design specifications area 2122 can store records specifying requirements according to various storage design specifications. Data repository 112 in area 2123 can store records of I/O events associated with each storage volume 150A-150N. Data repository 112 in area 2124 can store records of host attachment events associated with each storage volume 150A-150N.

Figure 2:
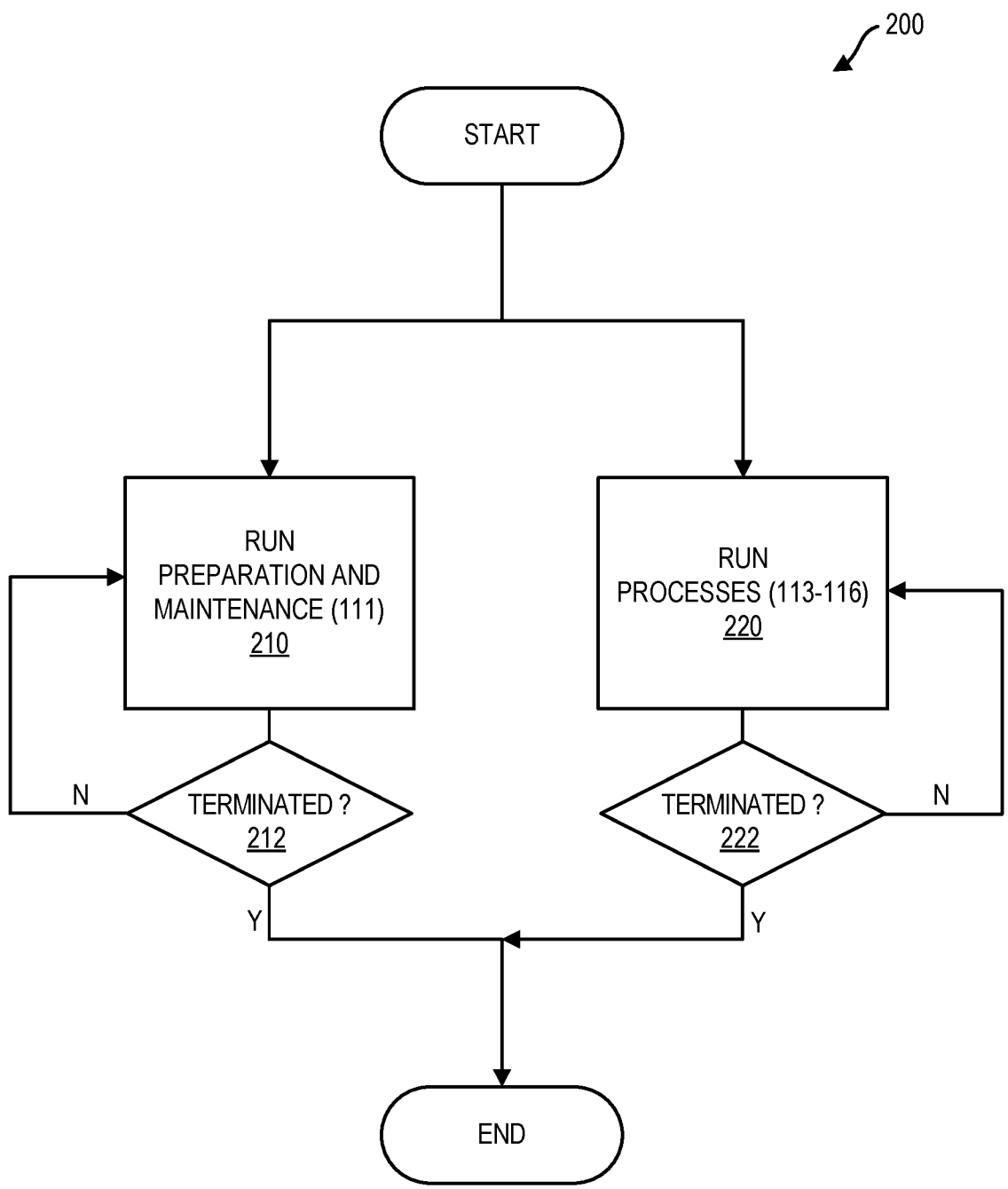
FIG. 2 is a flowchart illustrating a method that can be performed by manager system in one embodiment.

FIG. 2 is a flowchart illustrating a method 200 that can be performed by manager system 110. At block 210, manager system 110 can run preparation and maintenance process 111 to populate, prepare, and maintain various data of data repository 112 including data of area 2121, area 2122, area 2123, and area 2124. Manager system 110 can run preparation and maintenance process 111 until process 111 is terminated at block 212. At block 220, manager system 110 can run one or more of processes 113-116. Manager system 110 can run one or more or processes 113-116 until each of processes 113-116 is terminated at block 222.

For performance of preparation and maintenance process 111, manager system 110 can be configured to automatically process messages that are generated by one or more data source e.g. one or more external system 170. Manager system 110 can receive messages e.g. from one or more external system 170 and can process such messages e.g. by running a Natural Language Processing (NLP) process for storage of tagged data records in areas 2121-2124. Manager system 110 can run preparation and maintenance process 111 and one or more of processes 113-119 concurrently.

Manager system 110 can run preparation and maintenance process 111 so that data records of area 2121, 2122, 2123, and 2124 are continually populated and updated. Manager system 110 can run preparation and maintenance process 111 to process messages received from one or more external system 170. One or more external system 170 can be provided e.g. by a customer database that specifies data or processing requirements, the customer that formed part of a current license of a customer. One or more external system 170 can also be provided e.g. by storage hardware device vendor system supporting data on requirements of hardware storage devices or systems or services provided using various hardware storage devices. One or more external system 170 can also be provided e.g. by one or more database of a standard forming body that issues standards regarding data storage. Manager system 110 can run preparation and maintenance process 111 e.g. to activate various processes such as natural language processing (NLP) processes to process data from one or more external system 170 to automatically update records of license specifications area 2121 and design specifications area 2122 so that data of license specifications area 2121 and designs specifications area 2122 are continually updated and made current. One or more external system 170 can also include one or more financial market database storing data that can be processed for derivation of records for storage in design specifications area 2122.

Manager system 110 at block 210 (FIG. 2) can run preparation and maintenance process 111 to process messages received from storage environment 160, g. for storage of records into I/O history area 2123 and host attach history area 2124 of data repository 112. Manager system 110 can receive capacity and performance information of a storage volume e.g. storage volume from 150A, including data I/O size, volume name, amount of space written, I/O patterns and replication information from a controller 140A associated to the storage volume 150A. Capacity and storage information of storage volumes can be stored in "Not only SQL" (NoSQL) format.

In one embodiment, each storage volume 150A-150N can be provided by single accessible storage area within a single file system. In one embodiment, each storage volume 150A-150N can be provided by a storage device e.g. a fixed disk, a floppy disk, or a CD-ROM that is formatted to store directories and files. In one embodiment, each storage volume 150A-150N can be divided into more than one logical volume called a partition. In one embodiment, a set of storage volumes 150A-150N can be provided by hard disk array having a plurality of hard disks.

Storage volume controllers 140A-140N can be responsible for such activities such as I/O path management, as well as other data related functions, such as RAID and volume management, redundant array of independents disks (RAID) is a data storage virtualization technology that combines multiple physical disk drive components into a single logical unit for purposes of data redundancy performance improvement.

Storage system 130, can be a computing node based system that is responsible for a variety of functions including, implementing file systems that logically organize data as a hierarchical structure of directories and files on a set of storage volumes 150A-150N. Storage system 130 can also implement data compression functions for compressing data stored on one or more storage volume 150A-150N. In one embodiment, storage environment 160 can include a storage area network (SAN) storage environment. In one embodiment, storage environment 160 can include a networking attached storage (NAS) storage environment. In one embodiment, storage environment 160 can include device attached storage (DAS) storage environment. Where storage environment 160 is provided by a SAN, storage volumes of the SAN can provide storage for various host servers 152A-152N of a host system 162 which host system 162 with storage environment can define host-SAN system 164.

Storage environment 160 can include hardware defined storage and/or software defined storage. Software defined storage provides abstraction of logical storage from the underlying commodity hardware. Storage environment 160 can include a file system storage architecture which manages data as a file hierarchy a block storage architecture which manages data as blocks within sectors and tracks and/or object storage also known as object base storage is a computer data storage architecture that manages data as objects.

Figure 3:
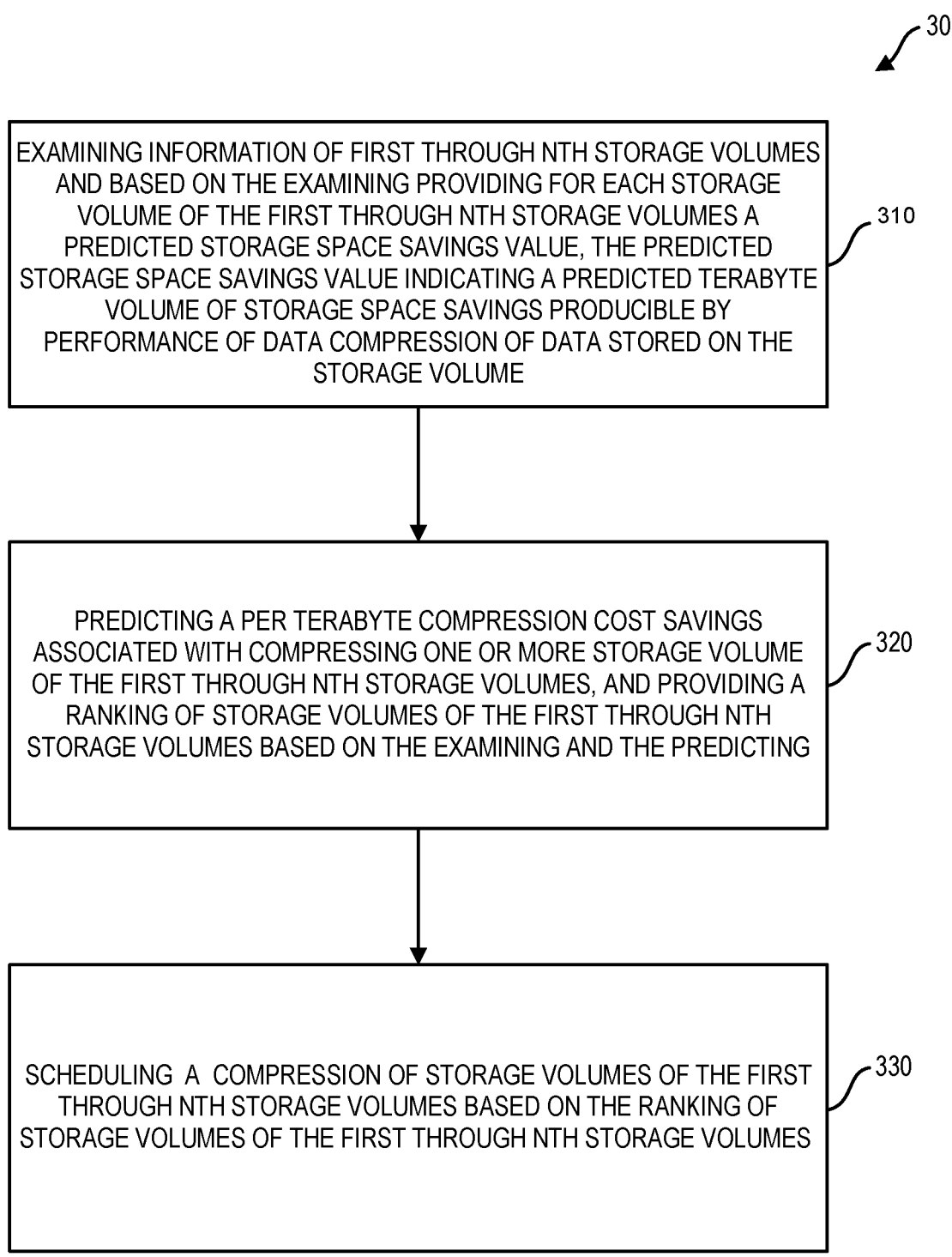
FIG. 3 is a flowchart illustrating a method for use in compressing data of storage volumes in one embodiment.

Manager system 110 in one embodiment can perform a method 300 as set forth in FIG. 3. At block 310 manager system 110 can perform examining information of first through Nth storage volumes and based on the examining, providing for each storage volume of the first through Nth storage volumes, a predicted storage space savings value. The predicted storage space savings value indicating a predicted terabyte volume of storage space savings producible by performance of data compression of data stored on the storage volume. At block 320, manager system 110 can perform predicting a per terabyte compression cost savings associated with compressing one or more storage volume of the first through Nth storage volumes and can further perform providing a ranking of storage volumes of the first through Nth storage volumes based on the examining and the predicting. At block 330, manager system 110 can perform scheduling compression of storage volumes of the first through Nth storage volumes based on the ranking of storage volumes of the first through Nth storage volumes.

For performance of examining at block 310, manager system 110 can activate terabyte storage volume savings prediction process 113 and in one embodiment, at block 310 can perform examining of information of one or more storage volume e.g. storage volume 150A-150N to provide a predicted storage space savings value. The predicted storage space savings value indicating a predicted terabyte volume of storage space savings producible by performance of data compression of the data storage stored on the storage volume. Manager system 110 at block 310, can activate terabyte storage volume savings prediction process 113 and can perform examining using the function as set forth in Equation 1:

$$P_{tbvs} = W_1F_1 + W_2F_2 + W_3F_3 + W_4F_4 + W_5F_5 \quad \text{(Equation 1)}$$

Where $P_{tbvs}$ is the predicted terabyte volume savings associated with performance of a specified data compression on a storage volume, where $F_1$ is the predicted terabyte volume savings according to a first factor, where $F_2$ is a predicted terabyte volume savings according to a second factor, where $F_3$ is a predicted terabyte volume savings according to a third factor, where $F_4$ is a predicted terabyte volume savings according to a fourth factor, where $F_5$ is a predicted terabyte volume savings according to a fifth factor, and where $W_1$-$W_5$ are weights associated with the first through fifth factor. Using Equation 1, manager system 110 can determine a predicted terabyte volume savings associated with data compression dependently according to several different factors and then can weigh the factors to determine an overall determination of a predicted terabyte savings associated with the data compression. Manager system 110 can apply Equation 1 with respect to each storage volume of a set of storage volumes 150A-150N.

Referring to Equation 1, factor $F_1$ can be a size factor e.g. a storage volume size of used and unused space. In general the more storage volume space that is used additional storage space savings can be available via compression. By contrast, if only a small amount of space of a storage volume has been used, a corresponding smaller terabyte volume space savings can be expected to be available.

Referring further the Equation 1, factor $F_2$ can be an I/O patterns factor. Embodiments herein recognize that terabyte storage volume savings can be affected by I/O patterns related to a storage volume. For example, if I/O patterns of a storage volume exhibit a first pattern a first result can be expected and if I/O patterns of a storage volume exhibit a second pattern a second result can be expected. One I/O pattern than can be examined is temporal locality. Storage volumes having higher degrees of temporal locality can be specified by manager system 110 according to factor $F_2$ to have greater predicted terabyte storage volume savings than volumes having lower degrees of temporal locality. Another I/O pattern that can be examined storage block size, e.g. 4K block 8K block storage. Manager system 110 according to factor $F_2$ can specify storage volumes having larger block sizes to have greater predicted terabyte storage volume savings than volumes having smaller block size based on larger block sizes being more likely to include data repetitions. Other I/O patterns monitored for include e.g. patterns in which SVC cache misses are tracked, and patterns in which randomness of data storage is profiled. Patterns can be combined. For example a pattern profile indicating high temporal locality, a high degree of randomness, and with instances of SVC cache misses can be specified to have a large predicted terabyte storage volume savings.

Further regarding Equation 1, factor $F_3$ can be a host attachment factor. Embodiments herein recognize that terabyte volume savings associated with the data compression can be affected by a host attachment pattern e.g. a pattern by which hosts attach and detach to a storage volume. Embodiments herein recognize that if a host attachment pattern exhibits a first pattern, a first result can be expected and if a host attachment pattern exhibits a second pattern a second result can be expected. According to factor $F_3$ the type of host a storage volume is attached to can in some cases predict what kind of data will be written to that storage volume in the future and therefore can be used as a predictor of terabyte storage volume savings associated to the storage volume. Manager system 110 can read names or other labeling information (e.g. IP address, network segment) of a host to determine a host type, e.g. application host, database host, production host (application or database), development host (application or database), test host (application or database), quality assurance host (application or database), etc.

Manager system 110 according to factor $F_3$ can specify storage volumes connected to a first type of host (e.g. database host) to have greater predicted terabyte storage volume savings than volumes connected to a second type of host (e.g. application). For example, manager system 110 can specify storage volumes connected to a first type of host (e.g. database host) to have greater predicted terabyte storage volume savings than volumes connected to a second type of host (e.g. application host) based on an expected greater incidence of repetitive data in a database host relative to an application host. Manager system 110 according to factor $F_3$ can specify storage volumes connected to a first type of host (e.g. production host) to have greater predicted terabyte storage volume savings than volumes connected to a second type of host (e.g. development host). For example, manager system 110 can specify storage volumes connected to a first type of host (e.g. production host) to have greater predicted terabyte storage volume savings than volumes connected to a second type of host (e.g. development host) based on an expected greater incidence of repetitive data in a production host relative to a development host in development. Manager system 110 according to factor $F_3$ can also determine network communication technology associated to a host. Manager system 110 according to factor $F_3$ can specify storage volumes connected to a host by a first type of network communication technology (e.g. Fibre Channel) to have greater predicted terabyte storage volume savings than volumes connected to host by a second type of attachment channel (e.g. Network File System (NFS), Common Internet File System (CIFS), Server Message Block (SMB) or Internet Small Computer Systems Interface (iSCSI). Fibre Channel is standardized in the T11 Technical Committee of the International Committee for Information Technology Standards (INCITS), an American National Standards Institute (ANSI)-accredited standards committee. NFS is an open standard defined in Request for Comments (RFC).

Further regarding Equation 1, factor $F_4$ can be a data characteristic factor. Embodiments herein recognize that characteristics of stored data can affect an expected terabyte volume savings associated with the data compression. Manager system 110, according to factor $F_4$ can examine various characteristics of data e.g. manager system 110 can examine a type of data. For example, manager system 110 according to factor $F_4$ can specify storage volumes storing transactional structured data such as structured database data may be specified to include greater predicted storage volume savings than storage volumes that store unstructured data based on structured data being more likely to include data repetitions. Examples of storage volumes storing structured transactional data include storage volumes storing online transaction processing (OLTP) data or storage volumes storing data warehouse database data such as storage volumes associated with enterprise software provided by SAP® or ORACLE®. SAP® is a registered trademark of SAP SE of Weinheim, Germany. ORACLE® is a registered trademark of Oracle Corporation of Redwood Shores, Ca.

Embodiments herein recognize that in some instances data type can provide an indication of whether data had been previously compressed. For example, if data of a storage volume includes e.g. video data, image data or audio which data types are particularly commonly subject to compression there may be minimal available additional compression that can be performed with respect to the stored data. Embodiments herein recognize that due to protocol requirements specific data types such as video data, image data or audio are likely to be compressed at the generation end or transmission end. Also workloads using encrypted data and heavily sequential write oriented workloads may be regarded to be poor compression candidates on the basis of likelihood of prior compression. Manager system 110 according to factor $F_4$ can specify storage volumes that store data of specified data types, e.g. video, image, audio, encrypted, write oriented workloads, to have smaller predicted terabyte storage volume savings than volumes that store data of data types other than the specified data types.

Manager system 110 for examining the characteristics of data in accordance with factor $F_4$ can examine whether data will be replicated. Storage volumes storing data that that is to be replicated in one embodiment can be specified to include greater predicted terabyte storage volume savings. Manager system 110 according to factor $F_4$ can specify storage volumes that store data that is to be replicated to have greater predicted terabyte storage volume savings than storage volumes that store data that is not to be replicated.

With further reference to Equation 1, factor $F_5$ can be provided by a data compressibility factor. Embodiments herein recognize that some data is more susceptible to being compressed than other data. Manager system 110 according to factor $F_5$ can specify storage volumes that store data that is highly compressible to have greater predicted terabyte storage volume savings than volumes that store data that is not highly compressible. For determining a compressibility of a data manager system 110 according to factor F5 can subject a sample of data of a storage volume to a test compression and can determine compressibility based on a result of the test compression. For example in one embodiment 1% or less of data of a storage volume can be subject to a test compression for determining compressibility according to factor F5.

Manager system 110 can apply Equation 1 with respect to each storage volume of a set of storage volumes 150A-150N to provide a predicted terabyte volume savings associated with perspective data compression associated with each of the volumes 150A-150N.

For performance of predicting block 320, manager system 110 can activate per terabyte cost savings prediction process 114 and can apply the function of Equation 2 set forth herein as follows:

$$P_{cstb} = W_A F_A + W_B F_B + W_C F_C + W_D F_D \qquad \text{(Equation 2)}$$

Where $P_{cstb}$ is the predicted cost savings per terabyte associated with a data compression for a given storage volume, where $F_A$ is a first factor for determining cost savings per terabyte associated with a data compression for the storage volume, where $F_B$ is a second factor for determining cost savings per terabyte associated with data compression for a storage volume, where $F_C$ is a third factor for determining cost savings per terabyte associated with data compression for a storage volume, where $F_D$ is a third factor for determining cost savings per terabyte associated with data compression for a storage volume, and where $W_A$-$W_C$ are weights associated with the respective various factors $F_A$, $F_B$, $F_C$, and $F_D$. Manager system 110, at block 320 can predict cost savings per terabyte independently using the various factors $F_A$, $F_B$, $F_C$, and $F_D$ and then can combine the factors as a product of weighted factors in accordance with Equation 2.

Referring to Equation 2, factor $F_A$ can be a tier factor. In a storage environment 160, storage can be provided in tiers of storage. Tiered storage is an underlined principal of information lifecycle management (ILM). Tiered storage is a storage networking method where data is stored on various types of storage volumes based on performance availability and recovery requirements.

In one embodiment Tier 0 storage can be used for mission critical files. Tier 0 storage devices can be provided by solid state storage devices which can be faster than tier 1 storage devices, which can be faster that tier 2 storage devices which can be faster that Tier 3 storage devices.

In one embodiment, Tier 1 storage can be used for mission critical, recently outsourced, or top secret files and can include expensive high quality media storage devices. Tier 2 storage volumes can be used to store seldom used files and can include less expensive media devices. Tier 3 storage volumes can be used to store unclassified files or rarely used files. In one scheme, tier 3 storage volumes can include slow spinning hard disk drives.

Embodiments herein in accordance with factor $F_A$ recognizes that a tier of storage data can affect a per terabyte savings prediction associated with a data compression. Performing data compression on higher tiered storage volumes on one hang can yield greater cost savings per terabyte given that with greater terabyte volumes being made available on more expensive storage volumes, greater cost savings per terabyte can be expected. On the other hand, performing compression processes on higher tiered storage volumes can be expected to yield greater costs also effecting predicting of per terabyte cost savings associated with performance of data compression based on tiers of storage volumes. In one embodiment according to method 300, compression can focus on more expensive storage. As higher tiers of storage have more features such as resiliency, faster access and greater throughput, compressing data on more expensive tiers first can yield greater savings. Also since performance is increased through compression, focusing compression on higher tiers can turbo charge the tier, where fast access and high throughput are valued.

A tier classification of a storage can be predetermined based on a design of a storage environment. Alternatively or additionally a tier classification can be dynamically determined based on usage of a storage volume. In one embodiment, manager system 110 can monitor input/output operations per second (IOPS) to determine a tier classification for a storage volume. Manager system 110 can read IPOS data e.g. from storage volume controller associated to a storage volume. Manager system 110 can specify a tier for a storage volume based on IOPS associated to a storage volume with higher tiers being specified for storage volumes featuring higher IOPS.

Referring further to Equation 2, factor $F_B$ can be provided by a storage volume model number factor. While storage tiers can be generally associated to different types of storage e.g. slower devices for lower tiers, solid state for tier 0. Embodiments herein recognize that cost savings associated with performance of a data compression can also be effected by model number of a storage volume, even within types of hardware storage volumes, there can be numerous variations depending on manufacturer, year, and the like, all of which can be represented by different model numbers. Data repository 112 in one embodiment can store performance data on different model numbers associated with different storage devices which can be accessed by manager system 110 for use in applying Equation 2 in accordance with factor $F_B$, storage volume model number factor. Storage model performance data can be stored in area 2122 of data repository 112, in general, in accordance with factor $F_B$ manager system 110 can assign predictions of greater per terabyte cost savings to more expensive storage volumes and can assign lower values for a predicted per terabyte cost savings to less expensive storage volumes.

Referring further to Equation 2, factor $F_C$ can be provided by a value to a business factor. Manager system 110 according to factor $F_C$, can examine a value of the data to the business. For example some businesses may choose to prioritize database data and other businesses may choose to prioritize data other than database data. In some business areas, recent data may be valued more significantly relative to aged data and thus for such businesses manager system 110 can assign predictions of greater per terabyte cost savings to recent data irrespective the form (e.g. structured or unstructured) and can assign lower values for a predicted per terabyte cost savings to aged data. In some business areas, aged data may be valued more significantly relative to recent data and thus for such businesses manager system 110 can assign predictions of greater per terabyte cost savings to aged data irrespective the form (e.g. structured or unstructured) and can assign lower values for a predicted per terabyte cost savings to recent data.

Manager system 110, according to factor $F_D$ can predict a cost savings per terabyte associated to a data compression based on a licensing factor. Embodiments herein recognize that licensing provisions of a data storage license can affect cost expenditures and cost benefits (i.e. cost savings) and therefore net cost savings associated to a performing of a data compression. According to factor $F_D$, manager system 110 can perform predicting of cost savings per terabyte based on data storage license parameters wherein different licensing charges may apply depending on a compressed or uncompressed status of data in a storage volume. According to factor $F_D$ manager system 110 can predict a higher per terabyte cost savings where according to a provision of a data storage license, lower licensing fees apply under a scenario of data being compressed. Factor $F_D$ can be established to that a value of a license to a licensee can be increased. For example, according to one common storage license provision licenses are sold in 50 TB increments of compressed space. Accordingly by choosing the storage volumes for compression according to methods herein license value to a licensee can be increased, e.g. by reducing storage used by a licensee to reduce an amount owed by a licensee under a storage license. For performing prediction according to factor $F_D$, manager system 110, query data of license specifications area 2121 of data repository 112, various aspects of a license can be considered e.g. licensing fee based on original size of volume, benefit of savings that differ by tier or device, attachment method, replication scheme, etc. A license charge based on the use of a storage increment, further subdivided into a charge based on an increment before compression is applied, or a charge based on an increment after compression is applied. Under some storage licenses, a charge to a licensee can be based on usable hardware storage capacity. Under some storage licenses a charge to a licensee can be based on usable capacity after some assumed compression ratio is applied. Under some storage licenses a flat-rate charge per physical storage device, storage controller, data center, or customer can be applied. Manager system 110, according to factor $F_D$ can specify a predicted per terabyte savings to a licensee under a storage license in effect.

Manager system 110 at block 320, can perform providing a ranking of storage volumes of the first through Nth storage volumes based on the examining at block 310 and the predicting 320 as set forth herein, the examining can include providing for each storage volume prediction of each storage volume savings for each storage volume. Further, a predicting at block 320 can include predicting of per terabyte cost savings. Thus, providing a of ranking storage volumes of the first through Nth storage volumes based on the examining and predicting can include multiplying the predicted volume of terabyte storage volume savings by a per terabyte cost savings as determined by the predicting at block 320 to determine, for each storage volume 150-150N a predicted total cost savings i.e. predicted volume of cost savings multiples by rate of cost savings equals predicted total cost savings. Manager system 110 at block 320 can determine a predicted total cost savings for each storage volume and can rank the storage volumes in an order according to the ranking of the list.

At block 330, manager system 110 can perform scheduling a compression of storage volumes of the first through Nth storage volumes based on the ranking of storage volumes of the first through Nth storage volumes.

In another aspect, manager system 110 can perform compressing of the various storage volumes 150A-10N in accordance with the scheduling of data compressions, scheduled with respect to the various storage volumes 150A-150N. Manager system 110 can compress various storage volumes, 150A-150N from the top of the list until either the hardware limit of the maximum number of a compressible volumes is reached or a point of zero financial return is reached.

As indicated, manager system 110 can perform scheduling compression of storage volumes of the first through Nth storage volumes based on a ranking of storage volumes provided at block 320. In another aspect, a ranking storage volumes can be subject to an adjusting by manager system 110. In one embodiment, manager system 110 can adjust a ranking of storage volumes by excluding one or more of the storage volumes according to an applied exclusion criteria.

Manager system 110 can be operative to apply an exclusion criteria to exclude one or more storage volume from a data compression process. Manager system 110 can apply a first exclusion criteria and can exclude one or more storage volumes from a data compression process, can apply a second exclusion criteria and can exclude one or more storage volumes according to a data compression process and so on until all exclusion criteria are examined. In one embodiment, compression can be performed via a Random Access Compression Engine (RACE), where RACE is embedded into a thin provisioning layer. For this example, a compression scheme becomes part of the spectrum virtualize stack, where it seamlessly integrates with existing system management design and provides non-disruptive conversation between compress and uncompressed volumes.

Referring again to Equation 2, it is seen that in some instances cost expenditures can outweigh cost benefits associated with a data compression for a certain storage volume of a set of storage volumes 150A-150N. Manager system 110, in such a situation can exclude a storage volume yielding such a result from a data compression process. Thus, one criteria in a list of exclusion criteria can be the criteria that a data compression will result in negative cost savings e.g. a net loss, and thus removal from a listed ranking of storage volumes having associated negative cost savings values. In one aspect application of method 300 (FIG. 3) can avoid subjecting a storage volume to compression processing even though compression is available. In one aspect application of method 300 (FIG. 3) can adjust a timing of subjecting a storage volume to compression processing even though compression is available. For example, compressing of a certain storage volume can be shifted in time to perform at a later time in favor of performing a compressing of storage volume which without method 300 would be subject to compression at a later time.

Manager system 110 in one embodiment, can also examine data of license specifications area 2121 of data repository 112 for determining that an exclusion criteria has been satisfied. In one aspect, license specification specified in a data record of area 2121 can specify that one or more storage volumes under a current license agreement are not to be subject to data compression. Based on such requirements being specified in a license specification, manager system 110 can remove a storage volume identifier from a ranking list of storage volume identifiers and accordingly a scheduling at block 330 and a subsequent compressing can be performed without the excluded storage volume being subject to data compression.

Manager system 110 for excluding one or more storage volumes from being subject to a data compression process can examine data of design specifications area 2122. An administrator e.g. using a user interface displayed on computer device 120 from time to time can specify new design requirements for storage and referencing in design specifications area 2122, which design specifications area can be supplemented by records populated by processing of messages from one or more external system 170, as set forth herein. According to one design specification that can be recorded in design specifications area 2122 certainly characterized storage volumes can be excluded from being subject to data compression. For example, a design specification record can be provided that specifies that storage volumes storing transaction logs from database are not to be subject to compression. Manager system 110 can examine such a record and where list ranking in order and priority of storage volumes includes an identifier or a storage volume having a transaction log from a database can exclude such a storage volume from a list of storage volume identifiers specifying a ranking of storage volumes. Accordingly, at block 330 such storage volume for storing a transaction log from database can be excluded from a schedule of data compression processes and such storage volume can be excluded from data storage compression can be excluded from be subjected to data storage compression.

Figure 4:
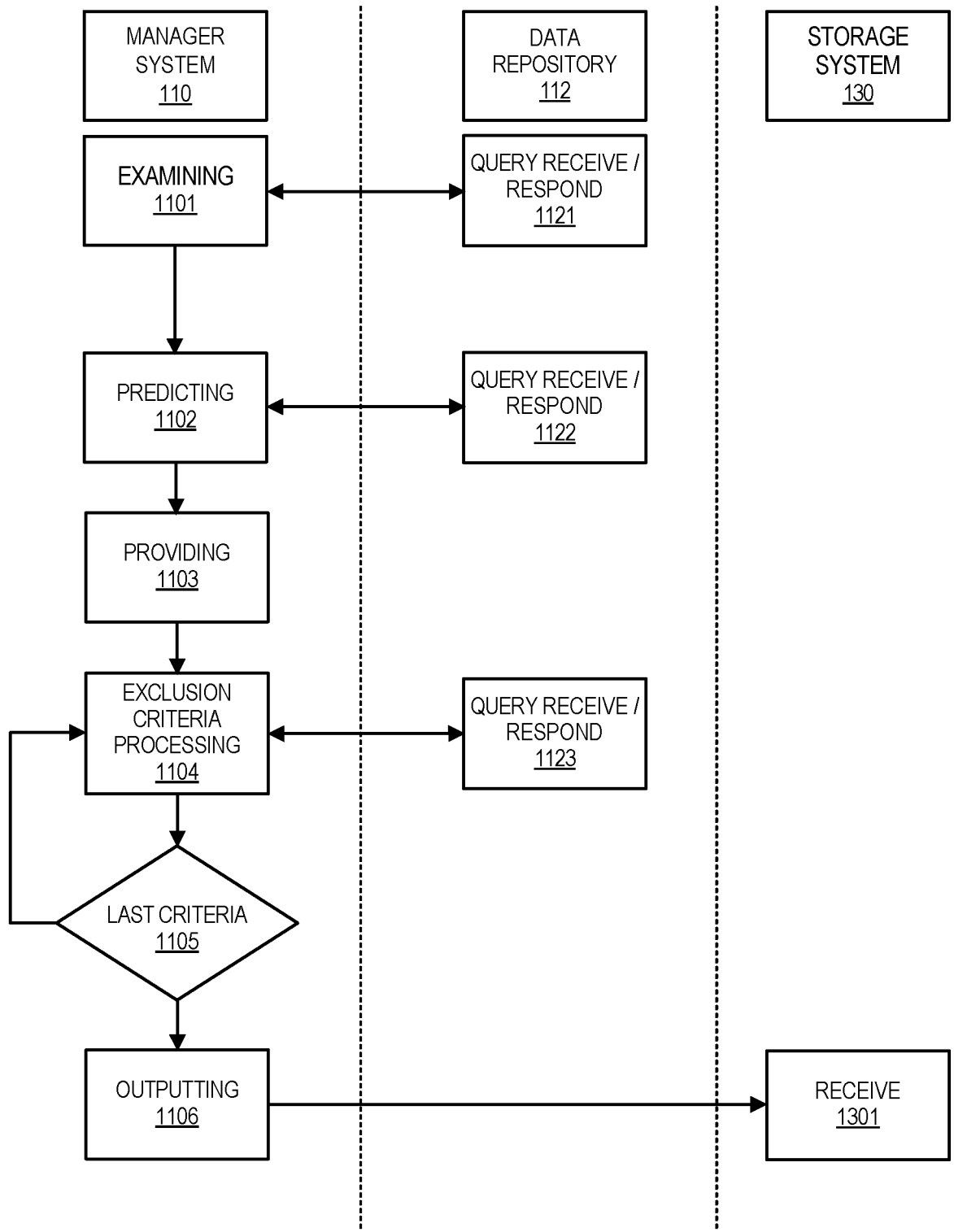
FIG. 4 is a flowchart illustrating a method for use in compressing data of storage volumes in one embodiment.

FIG. 4 illustrates an implementation of method 300, from the perspective of manager system 110, data repository 112, and storage system 130. At block 1101, manager system 110 can perform examining generally as set forth in reference to block 310 (FIG. 3) and in one embodiment can run terabyte storage volume savings prediction process 113 and can apply Equation 1 for performance of the examining. For performance of examining, manager system 110 can perform multiple data queries of data repository 112, and data repository 112 can respond to such multiple queries as indicated by query receive and respond block 1121.

At block 1102, manager system 110 can perform predicting generally in accordance with the predicting as set forth in reference to block 320 of method 300 as set forth in FIG. 3. At block 1102 in one embodiment manager system 110 can run per terabyte cost savings prediction process 114 and can apply Equation 2 as set forth herein. For the performance of the predicting at block 1102, manager system 110 can present multiple data queries to data repository 112. Data repository 112 can receive and respond to such data queries, as indicated by block 1122.

At block 1103, manager system 110 can perform providing of a ranking of storage volumes generally according to the providing as set forth in reference to block 320 of FIG. 3 as set forth herein. In providing a ranking of storage volumes, manager system 110 can rank storage volumes according to terms of total cost savings i.e. predicted terabyte storage volumes savings multiplied by the cost savings per terabyte prediction equals total cost savings.

At block 1104, manager system 110 can perform an exclusion criteria processing to determine whether a storage volume should be excluded from being subject to data compression according to a data compression schedule. For performance of exclusion criteria procession, at block 1104 manager system 110 can run qualification check process 115 and can make multiple data queries to data repository 112. Data repository 112 can receive and respond to such queries as indicated by query receive and respond block 1123. Exclusion criteria processing at block 1104 can include e.g. processing to determine whether a negative total cost savings is associated to a data compression as applied to a data storage volume, can include such processing as processing based on data of licensing specifications area 2121 of data repository 112 and processing based on design specifications data of design specifications area 2122 of data repository 112. At block 1105, manager system 110 can determine if a last exclusion criteria has been examined and if so can proceed to block 1106 to perform outputting of a communication to trigger scheduling of data compression of one or more storage volume and triggering a performing data compression of one or more storage volume.

For triggering of scheduling of data compression and performance of data compression with respect to one or more storage volume, manager system 110 at block 1106 can output a data compression schedule for receipt by storage system 130 at block 1301. Storage system 130 can be configured to respond to receipt of such data compression schedule by activating data compressions in accordance with the received data compression schedule e.g. according to an order of a data compression schedule, which order is based on a ranking of storage volumes which can be determined by manager system 110 at block 1103.

Figure 5:
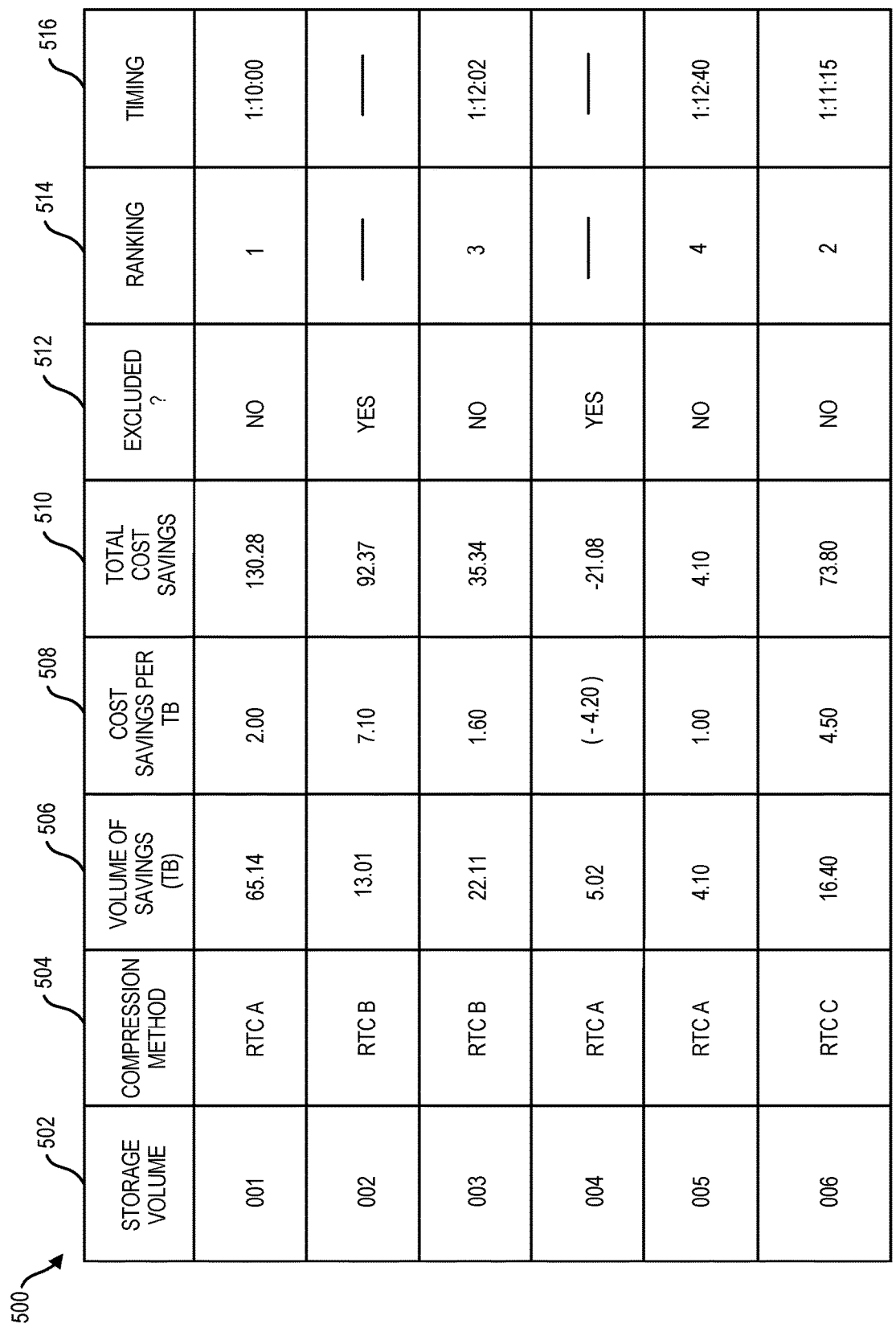
FIG. 5 depicts a data storage volume compression schedule in one embodiment.

In one embodiment, manager system 110 can output schedule 500 as shown in FIG. 5. Schedule in column 502 can specify identifiers for various storage volumes e.g. identifier 001-identifier 006. Schedule 500 in column 504 can specify a compression method associated to the storage volume e.g. While real time compression (RTC) compression schemes are specified in FIG. 5, compression schemes other than RTC compression schemes can be utilized e.g. delayed compressions schemes and/or write back compression schemes.

Schedule 500 at column 506 can specify a terabyte volume of savings associated with performance of a data compression as determined by performing of examining at block 310. Schedule 500 at column 508 can specify a per terabyte cost savings as predicted according to predicting block 320. Schedule 500 at column 510 can specify a predicted total cost savings associated with a performance of a data compression with respect to each of the storage volumes specified by the identifiers 001-006. Schedule 500 at column 512 can specify whether a storage volume has been excluded according to an exclusion criteria as determined by performance at block 1104 (FIG. 4). Referring to schedule 500, storage volumes identified by identifiers 002 and 004 have been subject to exclusion and accordingly can be excluded from being subjected to data compression. Schedule 500 at column 514 can specify a ranking associated with each storage volume qualified to be subject to performance of data compression. The storage volume identified by identifier 004 can be excluded on the basis, having an associated negative total cost savings associated with the data compression, in spite of having an associated positive value for terabyte volume of savings. Schedule 500 at column 516 can specify timing data for performance of data compression according the schedule 500, storage volume 001 having a priority ranking of 1 can be subject to data compression at time 1:10:00, storage volume 006, having a priority ranking of 2 can be subject to data compression at time 1:11:15, storage volume 003, having a priority ranking of 3 can be subject to data compression at time 1:12:02, storage column 005, having a priority ranking of 4 can be subject to data compression at time 1:12:40.

Certain embodiments herein may offer various technical computing advantages, involving computing advantages to address problems arising in the realm of computer networks such as management of data storage at various storage volumes. Compression of data of various storage volumes can be intelligently scheduled by way of methods set forth herein to yield an overall increase of available storage in a storage environment and maintenance of storage availability at consistent reliable layer. By way of methods herein unnecessary or wasteful compression processes can be avoided to free up processing resources to handle baseline or additional services. Embodiments herein can include artificial intelligence processing platforms featuring improved processes to transform unstructured data into structured form permitting computer based analytics and predictive decision making.

Figure 6:
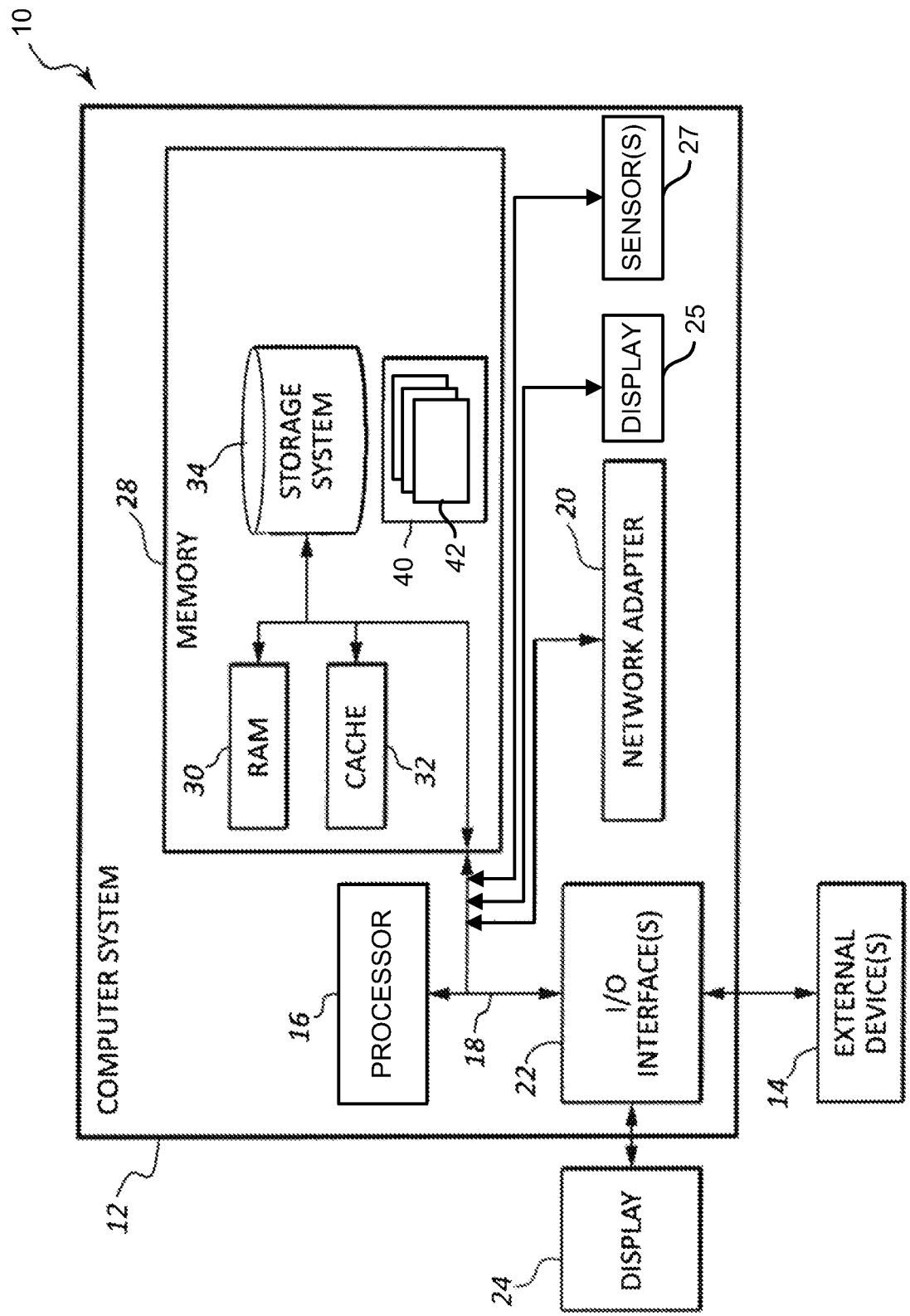
FIG. 6 depicts a computing node according to one embodiment.
Figure 7:
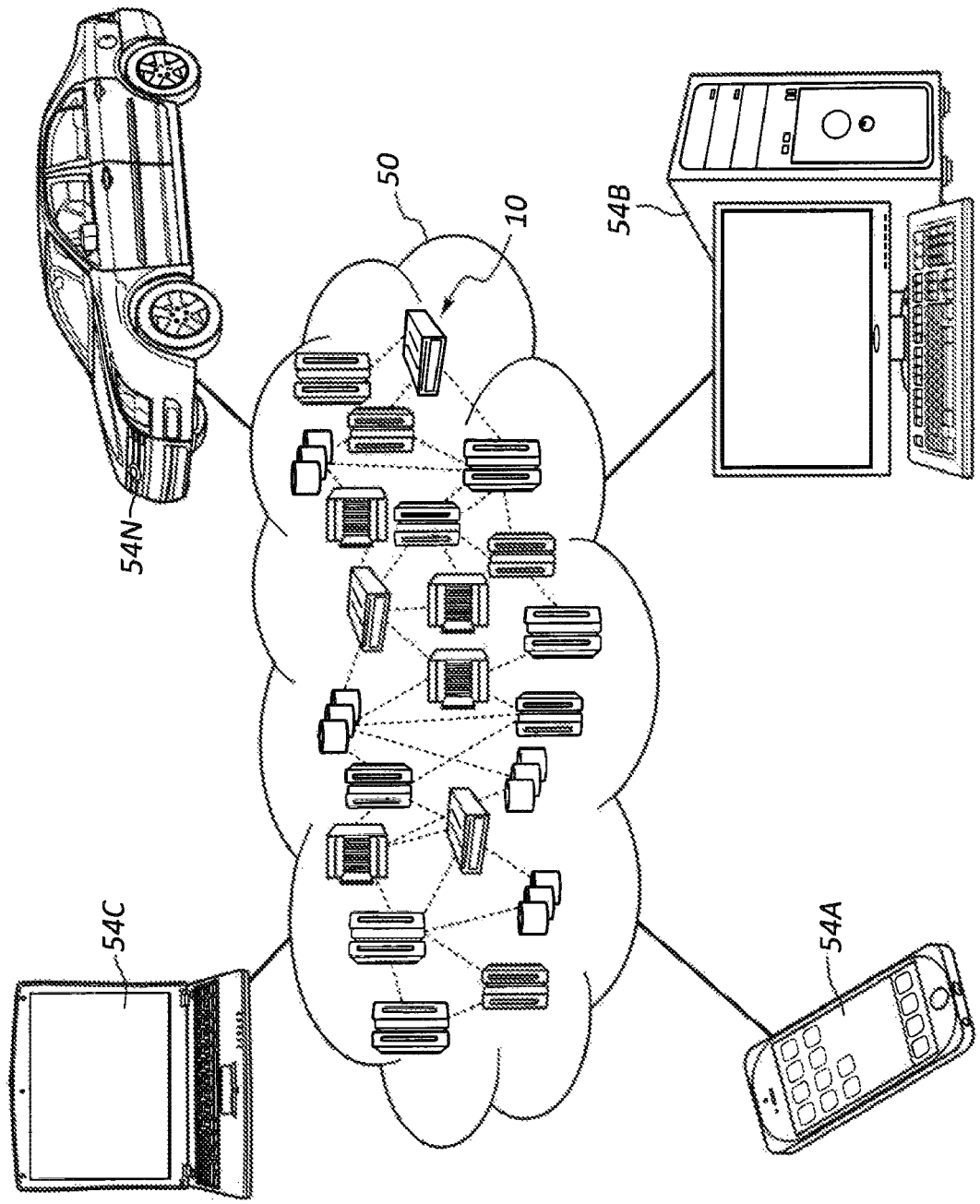
FIG. 7 depicts a cloud computing environment according to one embodiment.
Figure 8:
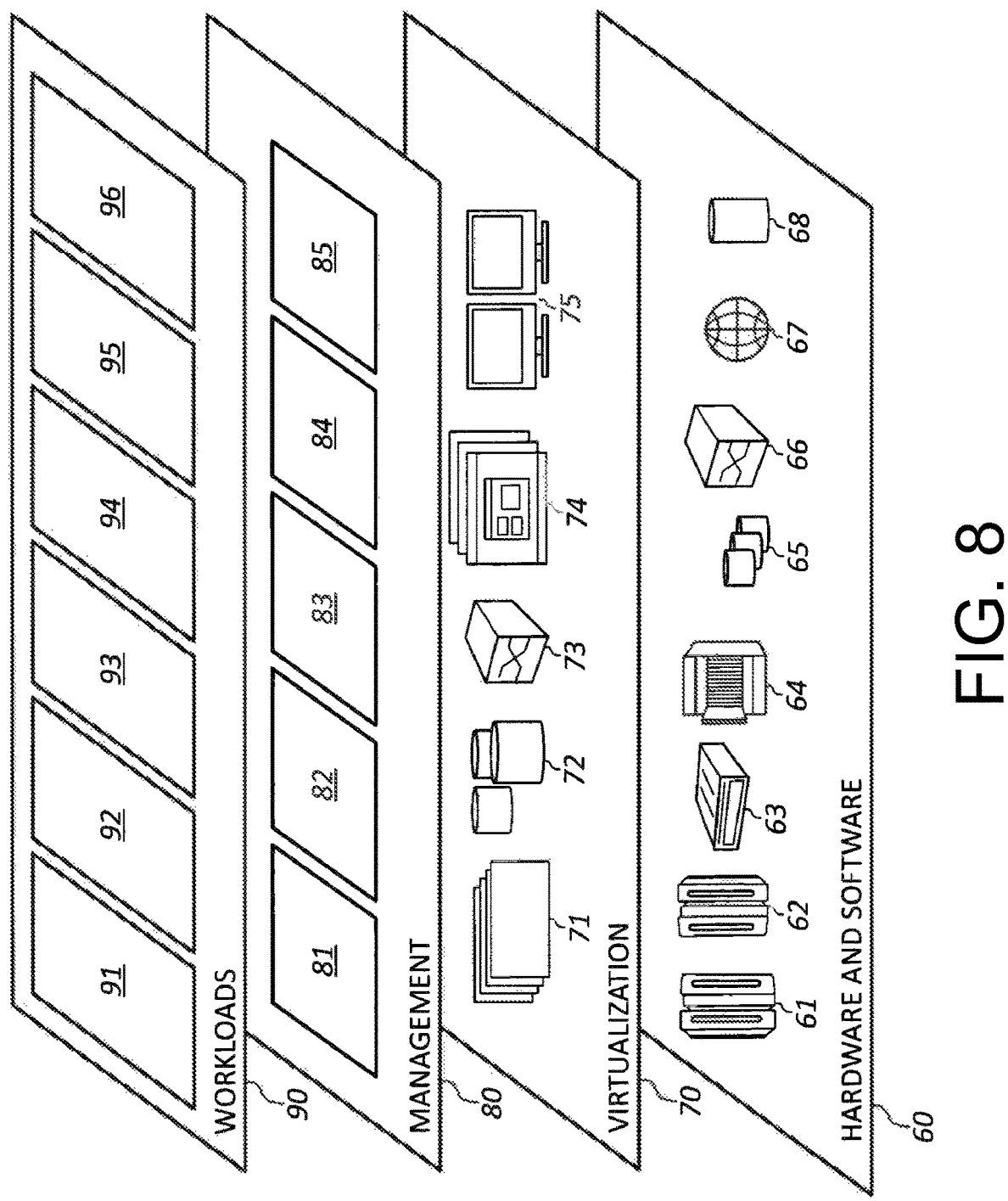
FIG. 8 depicts abstraction model layers according to one embodiment.

FIGS. 6-8 depict various aspects of computing, including a computer system and cloud computing, in accordance with one or more aspects set forth herein.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 6, a schematic of an example of a computing node is shown. Computing node 10 is only one example of a computing node suitable for use as a cloud computing node and is not intended to suggest any limitation as to the scope of use or functionality of embodiments of the invention described herein. Regardless, computing node 10 is capable of being implemented and/or performing any of the functionality set forth hereinabove. Computing node 10 can be implemented as a cloud computing node in a cloud computing environment, or can be implemented as a computing node in a computing environment other than a cloud computing environment.

In computing node 10 there is a computer system 12, which is operational with numerous other general purpose or special purpose computing system environments or configurations. Examples of well-known computing systems, environments, and/or configurations that may be suitable for use with computer system 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 12 may be described in the general context of computer system-executable instructions, such as program processes, being executed by a computer system. Generally, program processes may include routines, programs, objects, components, logic, data structures, and so on that perform particular tasks or implement particular abstract data types. Computer system 12 may be practiced in distributed cloud computing environments where tasks are performed by remote processing devices that are linked through a communications network. In a distributed cloud computing environment, program processes may be located in both local and remote computer system storage media including memory storage devices.

As shown in FIG. 6, computer system 12 in computing node 10 is shown in the form of a general-purpose computing device. The components of computer system 12 may include, but are not limited to, one or more processor 16, a system memory 28, and a bus 18 that couples various system components including system memory 28 to processor 16. In one embodiment, computing node 10 is a computing node of a non-cloud computing environment. In one embodiment, computing node 10 is a computing node of a cloud computing environment as set forth herein in connection with FIGS. 7-8.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 12 typically includes a variety of computer system readable media. Such media may be any available media that is accessible by computer system 12, and it includes both volatile and non-volatile media, removable and non-removable media.

System memory 28 can include computer system readable media in the form of volatile memory, such as random access memory (RAM) 30 and/or cache memory 32. Computer system 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program processes that are configured to carry out the functions of embodiments of the invention.

One or more program 40, having a set (at least one) of program processes 42, may be stored in memory 28 by way of example, and not limitation, as well as an operating system, one or more application programs, other program processes, and program data. One or more program 40 including program processes 42 can generally carry out the functions set forth herein. In one embodiment, manager system 110 can include one or more computing node 10 and can include one or more program 40 for performing functions described with reference to method 3 of FIG. 3, and the functions described with reference to manager system 110 as set forth in the flowchart of FIG. 4.

Computer system 12 may also communicate with one or more external devices 14 such as a keyboard, a pointing device, a display 24, etc.; one or more devices that enable a user to interact with computer system 12; and/or any devices (e.g., network card, modem, etc.) that enable computer system 12 to communicate with one or more other computing devices. Such communication can occur via Input/Output (I/O) interfaces 22. Still yet, computer system 12 can communicate with one or more networks such as a local area network (LAN), a general wide area network (WAN), and/or a public network (e.g., the Internet) via network adapter 20. As depicted, network adapter 20 communicates with the other components of computer system 12 via bus 18. It should be understood that although not shown, other hardware and/or software components could be used in conjunction with computer system 12. Examples, include, but are not limited to: microcode, device drivers, redundant processing units, external disk drive arrays, RAID systems, tape drives, and data archival storage systems, etc. In addition to or in place of having external devices 14 and display 24, which can be configured to provide user interface functionality, computing node 10 in one embodiment can include display 25 connected to bus 18. In one embodiment, display 25 can be configured as a touch screen display and can be configured to provide user interface functionality, e.g. can facilitate virtual keyboard functionality and input of total data. Computer system 12 in one embodiment can also include one or more sensor device 27 connected to bus 18. One or more sensor device 27 can alternatively be connected through I/O interface(s) 22. One or more sensor device 27 can include a Global Positioning Sensor (GPS) device in one embodiment and can be configured to provide a location of computing node 10. In one embodiment, one or more sensor device 27 can alternatively or in addition include, e.g., one or more of a camera, a gyroscope, a temperature sensor, a humidity sensor, a pulse sensor, a blood pressure (bp) sensor or an audio input device. Computer system 12 can include one or more network adapter 20. In FIG. 7 computing node 10 is described as being implemented in a cloud computing environment and accordingly is referred to as a cloud computing node in the context of FIG. 7.

Referring now to FIG. 7, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 10 and cloud computing environment 50 can communicate with any type of computerized device over any type of network and/or network addressable connection (e.g., using a web browser).

Referring now to FIG. 8, a set of functional abstraction layers provided by cloud computing environment 50 (FIG. 7) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and processing components 96 for use in performing data compression of storage volumes as set forth herein. The processing components 96 can be implemented with use of one or more program 40 described in FIG. 6.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Forms of the term "based on" herein encompass relationships where an element is partially based on as well as relationships where an element is entirely based on. Methods, products and systems described as having a certain number of elements can be practiced with less than or greater than the certain number of elements. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description set forth herein has been presented for purposes of illustration and description, but is not intended to be exhaustive or limited to the form disclosed. Many modifications and variations will be apparent to those of ordinary skill in the art without departing from the scope and spirit of the disclosure. The embodiment was chosen and described in order to best explain the principles of one or more aspects set forth herein and the practical application, and to enable others of ordinary skill in the art to understand one or more aspects as described herein for various embodiments with various modifications as are suited to the particular use contemplated.

What is claimed is:

1. A method comprising:
   examining information of first through Nth storage volumes to provide a predicted storage space savings value for respective ones of the first through Nth storage volumes, wherein the examining is based on a storage volume host attachment pattern factor;
   predicting a compression cost savings associated with compressing one or more storage volume of the first through Nth storage volumes;
   providing a ranking of storage volumes of the first through Nth storage volumes based on the examining and the predicting; and
   scheduling a compression of storage volumes of the first through Nth storage volumes based on the ranking of storage volumes of the first through Nth storage volumes.

2. The method of claim 1, wherein the examining is based on one or more of the following selected from the group consisting of a storage volume size factor, a storage volume I/O pattern factor, a storage volume data characteristic factor, and storage volume data compressibility factor.

3. The method of claim 1, wherein the examining includes applying the formula $$P_{tbvs}=W_1F_1+W_2F_2+W_3F_3+W_4F_4+W_5F_5$$

wherein $P_{tbvs}$ is a predicted terabyte volume savings associated with performance of a specified data compression on a storage volume, wherein $F_1$ is the predicted terabyte volume savings according to a first factor, wherein $F_2$ is a predicted terabyte volume savings according to a second factor, wherein $F_3$ is a predicted terabyte volume savings according to a third factor, wherein $F_4$ is a predicted terabyte volume savings according to a fourth factor, wherein $F_5$ is a predicted terabyte volume savings according to a fifth factor, and wherein $W_1$-$W_5$ are weights associated with the first through fifth factor, wherein the first factor $F_1$ is a storage volume size factor, wherein the second factor $F_2$ is a storage volume I/O pattern factor, wherein the third factor $F_3$ is the storage volume host attachment pattern factor, wherein the fourth factor $F_4$ is a storage volume data characteristic factor, and wherein the fifth factor $F_5$ is a storage volume data compressibility factor.

4. The method of claim 1, wherein the examining is based on an I/O pattern factor and wherein according the I/O pattern factor storage volume temporal locality is examined.

5. The method of claim 1, wherein the examining is based on an I/O pattern factor and wherein according the I/O pattern factor I/O frequency is examined.

6. The method of claim 1, wherein according to the host attachment pattern factor a type of host is examined, and wherein the type of host is a host type selected from the group consisting of a production database host, a development host, a test host, a quality assurance host.

7. The method of claim 1, wherein according to the host attachment pattern factor a type of network communication technology is examined, and wherein the type of network communication technology is selected from the group consisting of Fibre Channel, NFS, CIFS, SMB and iSCSI.

8. A computer program product comprising:
   a computer readable storage medium readable by one or more processing circuit and storing instructions for execution by one or more processor for performing a method comprising:
      examining information of first through Nth storage volumes to provide a predicted storage space savings value for respective ones of the first through Nth storage volumes, wherein the examining is based on a storage volume host attachment pattern factor;
      predicting a compression cost savings associated with compressing one or more storage volume of the first through Nth storage volumes;
      providing a ranking of storage volumes of the first through Nth storage volumes based on the examining and the predicting; and
      scheduling a compression of storage volumes of the first through Nth storage volumes based on the ranking of storage volumes of the first through Nth storage volumes.

9. The computer program product of claim 8, wherein the predicting is based on one or more of the following selected from the group consisting of a storage volume tier factor, a storage volume model factor, and a licensing factor.

10. The computer program product of claim 8, wherein the predicting includes applying the formula $$P_{cstb}=W_AF_A+W_BF_B+W_CF_C+W_DF_D$$

wherein $P_{cstb}$ is the predicted cost savings associated with a data compression for a given storage volume, wherein $F_A$ is a first factor for determining cost savings per terabyte associated with a data compression for the storage volume, wherein $F_B$ is a second factor for determining cost savings per terabyte associated with data compression for a storage volume, wherein $F_C$ is a third factor for determining cost savins per terabyte associated with data compression for a storage volume, wherein $F_D$ is a fourth factor for determining cost savings per terabyte associated with data compression for a storage volume, wherein $W_A$-$W_D$ are respective weights associated with the factors $F_A$-$F_D$, wherein $F_A$ is storage volume tier factor, wherein $F_B$ is a storage volume model factor, wherein $F_C$ is a value to a business factor and wherein $F_D$ is licensing factor.

11. The computer program product of claim 8, wherein the predicting is based on a licensing factor so that a value of storage license to a licensee is increased.

12. The computer program product of claim 8, wherein the method includes examining for at least one of the first through Nth storage volumes an exclusion criteria, wherein the exclusion criteria includes one or more of the following selected from the group consisting of: a negative cost savings criteria, a licensing provision criteria, and a design requirement criteria.

13. The computer program product of claim 8, wherein the method includes compressing storage volumes of the first through Nth storage volumes based on the scheduling.

14. The computer program product of claim 8, wherein the predicted storage space savings value indicates a predicted terabyte volume of storage space savings producible by performance of data compression of data stored on the storage volume.

15. The computer program product of claim 8, wherein the predicting a compression cost savings associated with compressing one or more storage volume of the first through Nth storage volumes includes predicting a per terabyte compression cost savings associated with compressing one or more storage volume of the first through Nth storage volumes.

16. The computer program product of claim 8, wherein the examining is based on each of a storage volume I/O pattern factor, the storage volume host attachment pattern factor, a storage volume data characteristic factor, and storage volume data compressibility factor.

17. The computer program product of claim 8, wherein the examining is based on a storage volume I/O pattern factor.

18. The computer program product of claim 8, wherein the examining is based on a storage volume data characteristic factor, and storage volume data compressibility factor.

19. A system comprising:
a memory;
at least one processor in communication with the memory; and
program instructions executable by one or more processor via the memory to perform a method comprising:
examining information of first through Nth storage volumes to provide a predicted storage space savings value for respective ones of the first through Nth storage volumes, wherein the examining is based on a storage volume host attachment pattern factor;
predicting a compression cost savings associated with compressing one or more storage volume of the first through Nth storage volumes;
providing a ranking of storage volumes of the first through Nth storage volumes based on the examining and the predicting; and
scheduling a compression of storage volumes of the first through Nth storage volumes based on the ranking of storage volumes of the first through Nth storage volumes.

20. The computer program product of claim 8, wherein according to the host attachment pattern factor a type of network communication technology is examined.

* * * * *